United States Patent [19]

Burnham et al.

[11] Patent Number: 4,824,798
[45] Date of Patent: Apr. 25, 1989

[54] METHOD OF INTRODUCING IMPURITY SPECIES INTO A SEMICONDUCTOR STRUCTURE FROM A DEPOSITED SOURCE

[75] Inventors: Robert D. Burnham, Wheaton, Ill.; Robert L. Thornton, East Palo Alto, Calif.

[73] Assignee: Xerox Corporation, Stamford, Conn.

[21] Appl. No.: 117,593

[22] Filed: Nov. 5, 1987

[51] Int. Cl.⁴ .................. H01L 21/265; H01L 21/203
[52] U.S. Cl. ............................. 437/81; 148/DIG. 75; 148/DIG. 34; 148/DIG. 37; 148/DIG. 59; 148/DIG. 97; 148/DIG. 110; 156/613; 437/82; 437/98; 437/110; 437/132; 437/161; 437/951; 437/987
[58] Field of Search ................... 148/DIG. 3, 15, 30, 148/34, 37, 48, 56, 59, 65, 72, 47, 110, 114, 123, 149, 157, 160, 169; 156/610-614; 357/16; 437/12, 81, 82, 97, 107, 110, 126, 132, 134, 139, 160, 161, 162, 233, 241, 247, 951, 987

[56] References Cited

U.S. PATENT DOCUMENTS

| 4,378,255 | 3/1983 | Holonyak, Jr. et al. | 437/23 |
| 4,594,603 | 6/1986 | Holonyak, Jr. | 357/16 |
| 4,615,766 | 10/1986 | Jackson et al. | 156/662 |
| 4,634,474 | 1/1987 | Camlibel et al. | 437/132 |
| 4,639,275 | 1/1987 | Holonyak, Jr. | 437/126 |
| 4,654,090 | 3/1987 | Burnham et al. | 437/110 |

OTHER PUBLICATIONS

Kasahara et al., "The Effect of Stress on the Redistribution of Implanted Impurities in GaAs", J. Electrochem. Soc., vol. 130, No. 11, Nov. 1983, pp. 2275-2279.
Bustarret et al., "Residual Disorder in Low-Temperature Polycrystalline Silicon", J. Elect. Mat., vol. 13, No. 4, 1984, pp. 673-687.
Epler et al., "Laser Induced Disordering of GaAs—AlGaAs Superlattice and Incorporation of Si Impurity", Appl. Phys. Lett., 49(21), 24 Nov. 1986, pp. 1447-1449.
Morin et al., "Polycrystalline Silicon by Glow Discharge Technique", Appl. Phys. Lett., 35(9), 1 Nov. 1979, pp. 686-687.
Ghandhi, VLSI Fabriction Principles; John Wiley & Sons, New York, NY, 1983, pp. 427-429.
G. R. Antell et al., "The Diffusion of Silicon in Gallium Arsenide", Solid-State Electronics, vol. 8, pp. 943-946 (1965), Pergamon Press, Gt. Brit.
E. Omura et al., "Closed-Tube Diffusion of Silicon in GaAs from Sputtered Silicon Film", Electronic Letters, vol. 22(9), pp. 496-498 (Apr. 24, 1986).

(List continued on next page.)

Primary Examiner—Brian E. Hearn
Assistant Examiner—William D. Bunch
Attorney, Agent, or Firm—W. Douglas Carothers, Jr.

[57] ABSTRACT

A thin film bilayer composite source comprises a deposited impurity source layer, e.g. Si or Sb, heavily doped with a diffusion enabling agent, e.g. As, and capped with a passivating layer, e.g. $Si_3N_4$, $SiO_2$, AlN or $SiO_xN_y$. In a preferred embodiment, a thin film bilayer composite source comprises a Si layer on the surface of said structure vapor deposited at a temperature in excess of 500° C. in the presence of a source of As to hevily dope the layer in the range of 5%-20% atomic weight and a thin cap layer of $Si_3N_4$ deposited on the Si layer at a temperature in excess of 500° C. having a thickness only sufficient to prevent the outdiffusion of Ga and As, which thickness may be about 400 Å-700 Å. An important aspect of the employment of this bilayer composite source as a diffusion source for III-V structures is that the composite source is initially deposited at high temperatures, above 500°0 C., i.e., at temperatures that are into the range of annealing temperature, e.g. about 500°-900° C., preferably 700°-850° C., so that cracking due to thermal strain or compressive stress will not occur on subsequent high temperature annealing thereby providing reproducible, uniform impurity diffusion into III-V structures. A particular application of bilayer composite source is in impurity induced disordering (IID).

3 Claims, 4 Drawing Sheets

OTHER PUBLICATIONS

T. Onuma et al., "Study of Encapsulants for Annealing Si-Implanted GaAs", Jornal of Electrochemical Society, vol. 129(4), pp. 837-840 (Apr., 1982).

M. E. Greiner et al., "Diffusion of Silicon in Gallium Aresnide Using Rapid Thermal Processing: Experiment and Model", Applied Physics Letters, vol. 44(8), pp. 750-752 (Apr. 15, 1984).

K. L. Kavanagh et al., "Silicon Diffusion at Polycrystalline-Si/GaAs Interfaces, Applied Physics Letters", vol. 47(11), pp. 1208-1210 (Dec. 1, 1985).

K. L. Kavanagh et al., "The Polycrystalline-Si Contact to GaAS", Journal of the Electrochemical Society, vol. 133(6), pp. 1176-1179 (Jun, 1986).

K. Meehan et al., "Disorder of an $Al_xGa_{1-x}As$—GaAs Superlattice by Donor Diffusion", Applied Physics Letters, vol. 45(5), pp. 549-551 (Sep. 1, 1984).

R. L. Thornton et al., "Highly Efficent, Long Lived AlGaAs Lasers Fabricated by Silicon Impurity Induced Disordering", Applied Physics Letters, vol. 49(3), pp. 133—134 (Jul. 21, 1986).

E. Omura et al., "Silicon Diffusion Into $Al_xGa_{1-x}As$ ($x=0$-$0.4$) From a Sputtered Silicon Film", Applied Physics Letters, vol. 50(5), pp. 265-266 (Feb. 2, 1987).

Tae Earn Shim et al, "Si Film As An Annealing Cap for Si-Implanted GaAs", Applied Physics Letters, vol. 48(10), pp. 641-643, (Mar. 10, 1986).

R. L. Thornton et al., "Low Threshold Planar Buried Hetrostructure Lasers Fabricated By Impurity-Induced Disordering", Applied Physics Letters, vol. 47(12), pp. 1239-1241 (Dec. 15, 1985).

METHOD OF INTRODUCING IMPURITY SPECIES INTO A SEMICONDUCTOR STRUCTURE FROM A DEPOSITED SOURCE

CROSS-REFERENCE TO RELATED APPLICATIONS

This application contains subject matter related to the subject matter of patent application Ser. No. 07/117,777, filed Nov. 5, 1987 and patent application Ser. No. 07/117,596, filed Nov. 5, 1987, both assigned to the same assignee herein.

BACKGROUND OF THE INVENTION

This invention relates to a method of introducing impurity species into a semiconductor structure and more particularly to the diffusion of impurity species from a thin film source deposited on a semiconductor structure.

It has been recognized that impurity diffusion into III-V compound semiconductors is an important step in the fabrication of optoelectronic devices. Recently, much attention has been given to the diffusion of Si into GaAs. Also, recently, considerable attention has been given to impurity induced disordering (IID) in GaAs/-GaAlAs quantum well structures.

In particular, the diffusion of silicon in GaAs has been under study and investigation for many years, As an example, G.R. Antell in an article, "The Diffusion of Silicon in Gallium Aresenide", *Solid-State Electronics*, Vol. 8, pp. 943–946 (1965), discloses the diffusion of Si into GaAs carried out at high temperatures in a sealed quartz capsule containing an overpressure of As to prevent the outdiffusion of As from the GaAs. The diffusivity and activation of Si in GaAs is proportional to the As overpressure and the Ga vacancy concentrations. Excess As pressure in a closed ampoule is required for successful diffusion. See, also, the more recent article on this subject of E. Omura et al, "Closed-Tube Diffusion of Silicon in GaAs From Sputtered Silicon Film", *Electronic Letters*, Vol. 22(9), pp. 496–498 (Apr. 24, 1986).

More recently, the effects of encapsulation relative to Si implanted into GaAs have been studied to prevent the outdiffusion from GaAs and provide, in some cases, a source of Si for diffusion into GaAs. See the article of T. Onuma et al, "Study of Encapsulants for Annealing Si-Implanted GaAs", *Journal of Electrochemical Society*, Vol. 129(4), pp. 837–840 (April, 1982). Diffusion of Si was enhanced by $SiO_2$ encapsulation but was negligible with $Si_2N_4$ encapsulation or when capless. The activation of the diffusion process is initiated at high anneal temperatures, such a s 750° C. and above. Onuma et al indicates that the $SiO_2$ cap layer is permeable to Ga while the $Si_3N_4$ cap layer is impermeable to Ga and As so that $SiO_2$ permits the diffusion of Ga to provide for Ga vacancies in the GaAs and the substitution of Si. However, due to the deposition method employed, cracks developed in some of the samples when subjected to the subsequent high temperature annealing process.

M.E. Greiner et al in the article, "Diffusion of Silicon in Gallium Arsenide Using Rapid Thermal Processing: Experiment And Model", *Applied Physics Letters*, Vol. 44(8), pp. 750–752 (Apr. 15, 1984) examines Si diffusion from a thin elemental deposited source thereof using rapid thermal processing with several different encapsulants. The results show that diffusion was dependent on the type of encapsulant. The Si source layer and the encapsulants were deposited at relative low temperatures, i.e. below 450° C., with subsequent annealing being accomplished at high temperatures of 850° C.-1050° C. High concentrations of Si diffused into GaAs resulted from a $SiO_2$ capped thin Si source layer. In particular, a model proposed by Greiner et al explains that paired Si atoms can move substitutionally by exchanging sites with either Ga or As vacancies which explains the enhanced diffusion when using a $SiO_2$ cap.

More recently, K.L. Kavanagh et al in the articles, "Silicon Diffusion at Polycrystalline-Si/GaAs Interfaces", *Applied Physics Letters*, Vol. 47(11), pp. 1208–1210 (Dec. 1, 1985) and "The Polycrystalline-Si Cintact to GaAs", *Journal of the Electrochemical Society*, Vol. 133(6), pp. 1176–1179 (June, 1986), reveals that, under proper conditions, the addition of As to the Si source layer revealed further enhanced diffusion, i.e. grater concentrations, of Si into the GaAs. These conditions called for depositing hydrogenated amorphous Si (a-Si:H) onto GaAs in a silane plasma at 450° C. and subsequent annealing at temperatures between 600° C.-1020° C. The results showed that high level interdiffusion of Si atomic pairs with Ga and As vacancies occurs when As is initially added to the Si source layer. However, the surface area of films deposited onto GaAs continued to have a large number of randomly spaced bubbles, indicative of compressive stresses in the film, developed after the high temperature annealing process.

It is an object of this invention to provide a method of introducing impurity species into a semiconductor structure from a deposited impurity source without incurring bubbles or cracks or other irregularities in the film or to the underlying semiconductor structure.

SUMMARY OF THE INVENTION

According to this invention, a thin film bilayer composite source is deposited on a semiconductor structure that is stable at high annealing temperatures required for the activation of the diffusion process so that pin holes, cracks, bubbles or other such irregularities do not appear in the deposited film or in the underlying semiconductor structure. Further, the bilayer composite source passivates the surface of the semiconductor structure such that it is not necessary to provide an As overpressure in order to accomplish the impurity diffusion process. Thus, the diffusion process can be accomplished in an open tube furnace in the presence of nitrogen or other passivating gas, rather than in a sealed ampoule filled with an As overpressure.

The thin film bilayer composite source of this invention comprises a deposited impurity source layer, e.g. Si or Ge, heavily doped with a diffusion enabling agent, e.g. As. P or Sb in the range of 5%–20% atomic weight, and capped with a passivating layer, e.g. $Si_3N_4$, $SiO_2$, AlN or $SiO_xN_y$. In a preferred embodiment, a thin film bilayer composite source comprises a Si layer on the surface of said structure vapor deposited at a temperature in excess of 500° C. in the presence of a source of As to heavily dope the layer in the range of 5%–20% atomic weight and a thin cap layer of $Si_3N_4$ deposited on the Si layer at a temperature in excess of 500° C. having a thickness only sufficient to prevent the outdiffusion of Ga and As, which thickness is in the range of about 400 Å–700 Å.

An important aspect of the employment of this bilayer composite source as a diffusion source for III-V structures is that the composite source is initially deposited at high temperatures, above 500° C., i.e., at temperatures that are into the range of annealing temperatures, e.g. about 500° C.–900° C., preferably 700° C.–850° C., so that cracking due to thermal strain or compressive stress will not occur on subsequent high temperature annealing thereby providing reproducible, uniform impurity diffusion into III-V structures. Further, hydrogenated amorphous Si deposition is not employed since it results in the boiling off of hydrogen from the a-Si:H source when subjected to the high annealing temperatures causing the deposited film to bubble. This bubbling subjects the semiconductor structure to nonuniform diffusion of Si during the annealing step. The initial high temperature deposition of the bilayer composite source substantially reduces, if not eliminates, the occurrence of cracks caused by thermal strain and compressive stress in later high temperature annealing or the formation of film bubbles due to the outdiffusion of hydrogen in later high temperature annealing.

The method of this invention, therefore, comprises introducing impurity species into a III-V semiconductor structure employing a bilayer composite source heavily doped with a diffusion enabling agent comprising the steps of depositing a diffusion source layer heavily doped with a diffusion enabling agent on the surface of the III-V structure, depositing an overlaying cap layer on the diffusion source layer, and annealing the structure to a temperature sufficient to cause the diffusion of the source into the semiconductor structure, the temperatures utilized in the deposition of the bilayer composite source being in the range of high temperatures utilized to carry out a high temperature annealing process. In a preferred embodiment of this invention, a method of introducing impurity species into a III-V semiconductor structure, e.g., a GaAs layer, comprises the steps of chemically depositing a Si diffusion source layer on the surface of the III-V structure in a temperature range of about 500° C.–900° C. in the present of a source of As heavily doping the diffusion layer in the range of 5%–20% by atomic percent, thereafter chemically depositing a thin cap layer of $Si_3N_4$ on the Si diffusion source layer within the same above mentioned temperature range, and thereafter annealing the semiconductor structure at a high temperature within the same above mentioned temperature range to thermally diffuse Si into the III-V structure.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
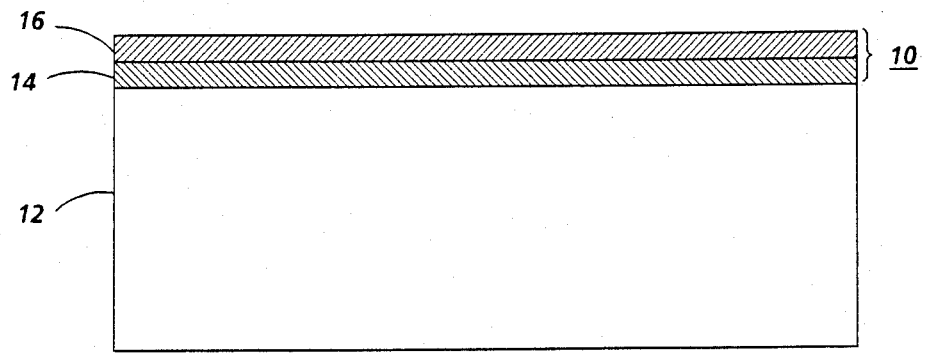
FIG. 1 is a side elevation of a thin film composite source of this invention deposited on a substrate.

Reference is now made to FIG. 1 wherein there is shown the thin film bilayer composite source 10 of this invention. Bilayer composite source 10 is deposited on a semiconductor structure 12. Structure 12 may be a III-V compound or alloy comprising III-V compositional constituents (e.g., Ga, As and/or Al) or may be comprised of one or more or a series of III-V layers or may be a III-V substrate, e.g. GaAs. Source 10 consists of two deposited layers having preferred deposited characteristic and comprise an impurity source layer 14 heavily doped with a diffusion enabling agent and a cap passivating layer 16. Impurity source layer 14, may be, for example, Si or Ge heavily doped with As, P or Sb and passivating layer 16 may be comprised of Si]hd 3$N_4$, $SiO_2$, AlN or $SiO_xN_y$. Other impurity species that also may be applicable to enhance the interdiffusion of compositional constituents, e.g. Ga and Al, would the presence of a high number of defects (besides the presence of vacancies or even proton damage in structure 12) in form of shallow or deep impurities such as, Se, Sn, O, S, Be, Te, Si, Mn, Cd, Sn or Cr. Also, these defects could be additions from other column III-V elements, such as, B, N. Al, Ga or In. In the preferred embodiment, impurity source layer 14 is comprised of Si doped with As in the range of 5%–20% atomic per cent and a thin cap layer 16 of $Si_3N_4$. Si is preferred because it will deposit in a polycrystalline state using high temperature processing whereas Ge will tend to deposit more crystalline at such temperatures and, therefore, a more tightly packed molecular structure, which is not desirable for an impurity source layer. $Si_3N_4$ is preferred because of its high level of impermability to III-V elements, e.g. Ga and As whereas $SiO_2$, for example, permits some outdiffusion of Ga. It appears that some outdiffusion of Ga without any outdiffusion of As from structure 12 is desirable in order to enable the Si diffusion process. In the case of source 10, distribution of Si and Ga occurs between impurity source layer 14 and structure 12.

Bilayer composite source 10 is deposited a high temperatures, i.e. at temperatures in excess of 500° C. Temperatures in excess of 500° C. also happen to approximate the point at which the elemental constituents of III-V compounds will begin to dissociate. A typical example of the deposition process is as follows: Structure 12 for the purposes of this example is a GaAs substrate which is positioned on the receptor of a MO-CVD reactor. The run temperature of the reactor is set at 678° C., which is approximately the temperature existing at the reactor receptor where chemical deposition will take place. This temperature is maintained throughout the deposition of layers 14 and 16. The deposition of these layers may be in the range of 500° C.–900° C., preferably in the range of 600° C.–800° C.

The first layer deposited is polycrystalline Si in the presence of a heavy concentration of As. $SiH_4$ is fed into the reactor at 20 sccm with 10% $AsH_3$ at 500 sccm via a carrier gas of $H_2$ at 30 sccm. 10% $AsH_3$ means that the AsH₃ gas is 10% diluted in H₂ gas. The flow of these gases (SiH₄+AsH₃→Si(As)) is maintained for about five minutes to produce a deposited layer 14 on structure 12 being about 400Å thick film of poly Si doped with As at about 10% atomic per cent.

Next, the source of 10% AsH₃ is reduced to 200 sccm and the flow of NH₃ gas is commenced and fed into the reactor at 90 sccm with SiH₄ flow still at 20 sccm in the same carrier gas concentration of H₂ at 30 sccm. The continued flow of AsH₃ is optional and, therefore, may be discontinued. However, it is believed that its presence may help to prevent any As outdiffusion from substrate 12 and deposited layer 14.

The flow of gases is maintained for 25 minutes to produce a deposited layer 16 comprising about 400Å film of Si₃N₄ (SiH₄+NH₃→Si₃N₄). Layer 16 should remain relatively thin, e.g, within the range of 400Å–700Å. It is preferred that layer 16 be sufficiently thick to prevent any substantial outdiffusion of Ga or As from structure 12 or layer 14. The thickness of impurity source layer 14 is not critical. The range of thickness for layer 14 in our work has been about 200Å–400Å. Layer 14, however, should be sufficiently thick to provide sufficient Si source to ensure food diffusion penetration of Si during subsequent high temperature annealing. On the other hand, layer 14 should not be so thick as to introduce thermal strain effects that may anomalous diffusion profiles. While such anomalous diffusion has been found not to occur with the application of high temperature impurity source CVD prior to high temperature annealing, a diffusion source layer to thick could introduce such strain effects.

After the growth of source 10, structure 12 is placed in a quartz tube inside a standard heating oven. The diffusion depth of Si into GaAs substrate 12 proceeds approximately as the square root of the annealing time. As an example relative to the above described deposition of source 10, annealing at 10 hours at 850° C. produces a diffusion depth of approximately 1.4 μm in GaAs substrate 12. The annealing may be carried out generally in the range of 700° C.–900° C., although there may be some overlap at either end of this range. If the technique of rapid thermal annealing is employed, e.g. as disclosed in M.E. Greiner et al, supra, K.L. Kavanagh et al, supra, and U.S. patent application, Ser. No. 07/117,596, supra temperatures may be in the range of 900° C.–1100° C.

In the example referred to above, the deposition of source 10 was carried out at 678° C. and the annealing was carried out at 850° C. These two temperatures fall in the range of high temperature processing, i.e., between about 500° C.–900° C., found necessary to obtain samples fee of bubbles or cracks in source 10 and structure 12. In the case of K.L. Kavanagh et al, bubbles appear due to the boiling of hydrogen at the high thermal annealing temperatures used in the annealing process. In the case of the deposition of source 10, described above, the high temperature of operation prevents hydrogen from condensing into deposited layers 14 and 16. Further, cracks do not appear in source 10 or structure 12 due to compressive strain as source 10 has been originally deposited at temperatures commensurable with high temperature annealing.

Figure 3:
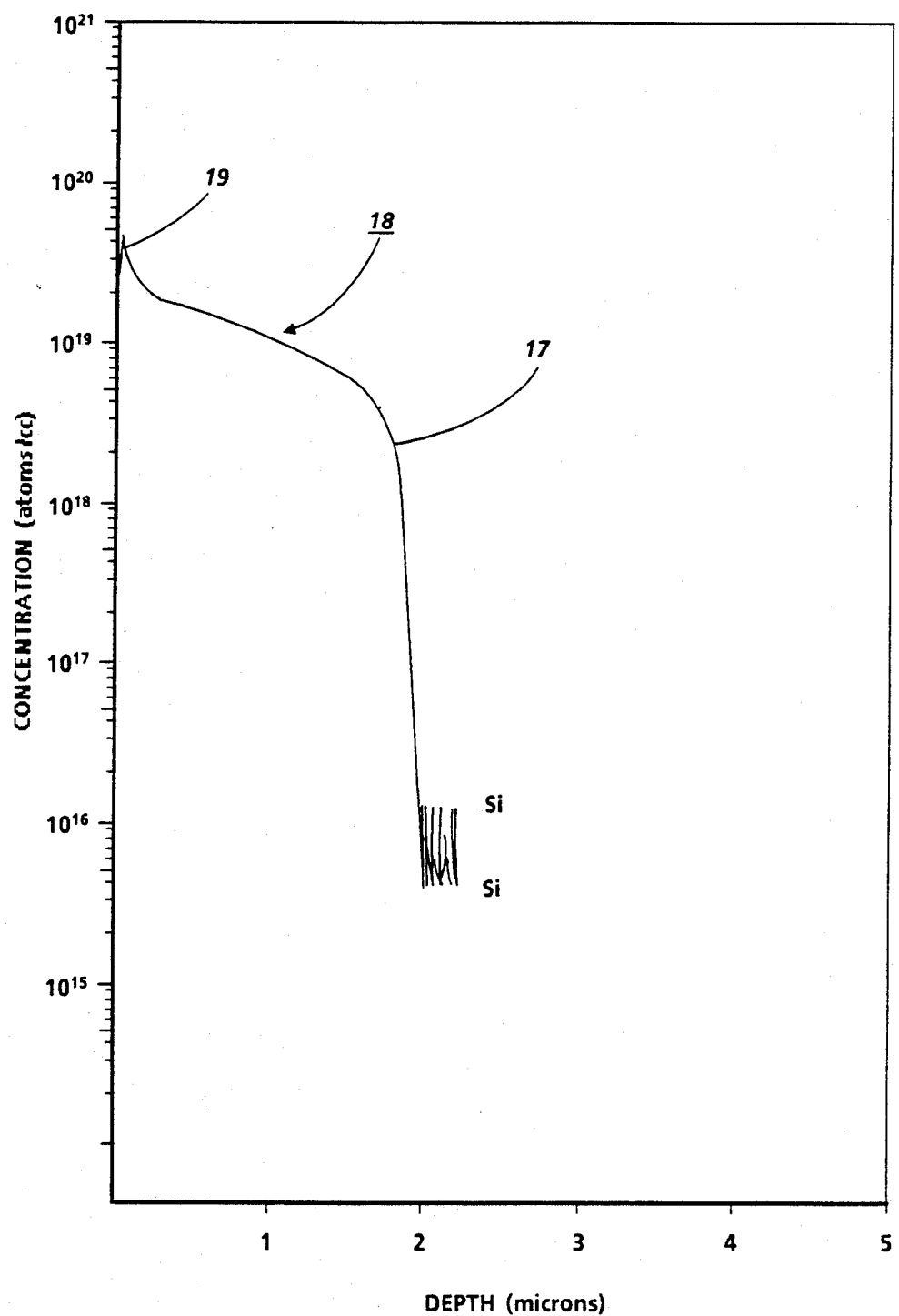
FIG. 3 is a secondary ion mass spectroscopy (SIMS) profile illustrating the extent and magnitude of Si diffusion from a thin film composite source into an underlying GaAs substrate.

FIG. 3 shows a typical SIMS profile for an example of the type discussed above. The Si concentration profile is after eight hours of anneal at 850° C. for the example. As exhibited by curve 18 in FIG. 3, there is high concentration of Si of about $2 \times 10^{19}$ at the surface of GaAs substrate 12, as indicated at point 19, with a gradual drop in concentration to $3 \times 10^{18}$ to knee 17, after which there is a large fall off of Si concentration at about the depth of 2 μm into GaAs substrate 12. This contrasts very significantly with T. Onuma et al, supra, and M.E. Greiner et al, supra, which indicate negligible diffusion occurring when employing a Si₃N₄ encapsulation, respectively, on a GaAs substrate and on a Si layer deposited on a GaAs substrate. Thus, it is seen that the combination layer composite source 10 of this invention brings about significant diffusion depth concentrations when there is sufficient quantities of a diffusion enabling agent in impurity source layer 14 in combination with a cap layer 14 highly impervious to III-V elements, i.e., provides a high level of passivation of underlying layers and their elemental constituents.

K.L. Kavanagh et al, supra, demonstrated that As doing of a Si diffusion layer is important toward achieving controlled Si diffusion into GaAs but the low temperature plasma enhanced CVD for the deposition of the Si diffusion layer will yield cracks or bubbles when subjected to subsequent high temperature anneal processing. In employing the high temperature processing of this invention in depositing bilayer composite source 10 followed with high temperature annealing, surface integrity of semiconductor structures 12 and source 10 is maintained throughout the several steps of high temperature processing, providing uniform and reproducible results in diffusion profiles and applications of this technique to device fabrication.

Figure 2:
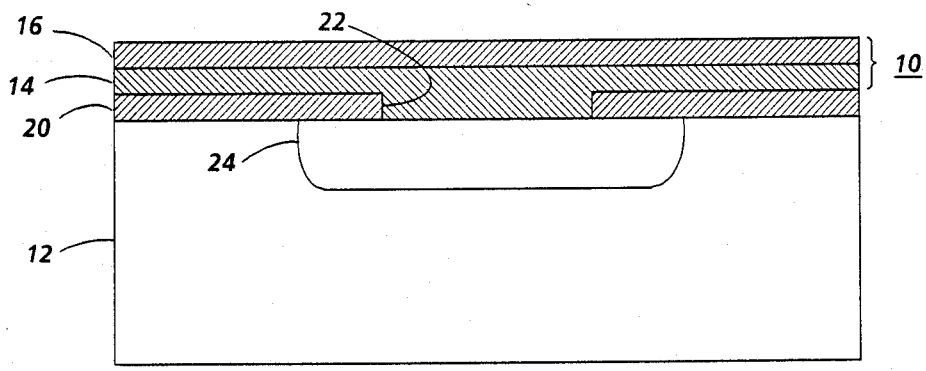
FIG. 2 is a side elevation of thin film composite source of this invention deposited on a masking layer which is deposited on a substrate.

Bilayer diffusion source 10 may be applied in combination with masking techniques to provide for selective patterning of impurity diffusion into a semiconductor structure. Such a patterned diffusion source is illustrated in FIG. 2. Prior to the deposition of source 10, a masking layer 20 of Si₃N₄ is deposited on the surface of semiconductor structure 12. Layer 20 is deposited in the same manner as previously explained relative to cap layer 16. After its deposition, structure 12 is removed from the MO-CVD reactor and a selective etch is preformed in layer 20, using techniques as known in the art, to produce pattern 22 by removing portions of Si₃N₄ film 20 to expose surface regions of structure 12. Next, source 10 is deposited in a manner as previously explained relative to FIG. 1, followed by annealing at a high temperature, such as 825° C., producing a Si diffusion profile 24 in structure 12.

Figure 4:
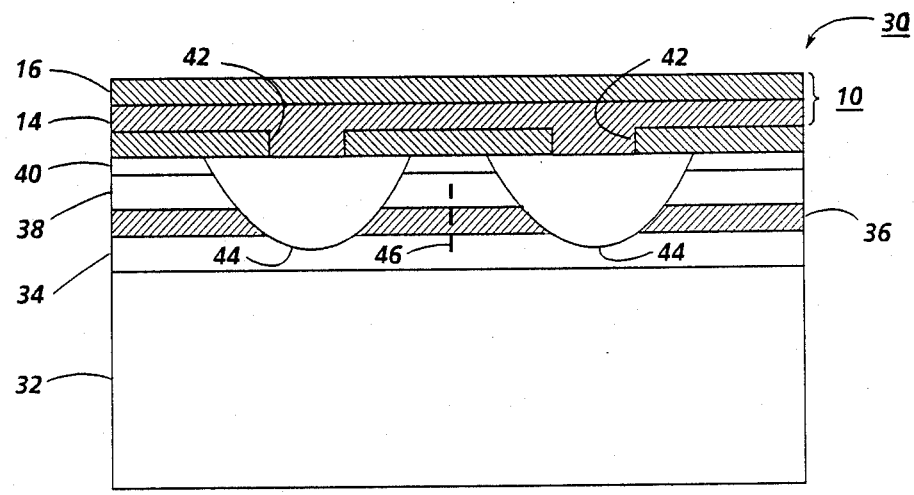
FIG. 4 is a side elevation illustrating an impurity induced disordering (IID) application of the thin film composite source of this invention relative to a multiple layer semiconductor structure which includes a quantum well active region.
Figure 5:
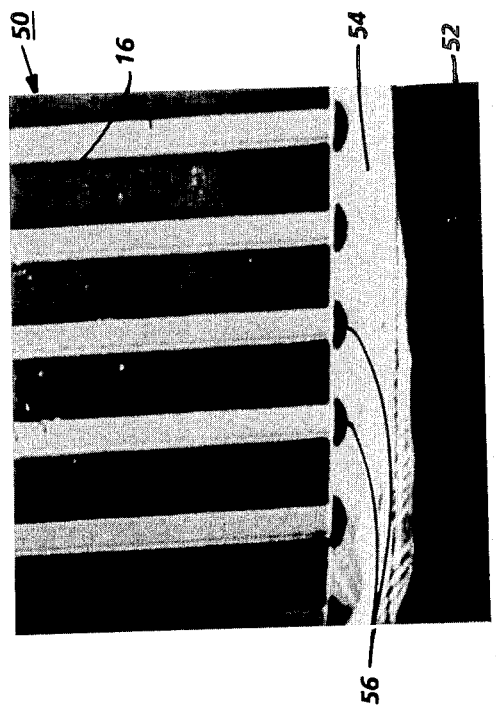
FIG. 5 is isometric SEM image of a semiconductor structure with the deposited thin film composite source of this invention.
Figure 6:
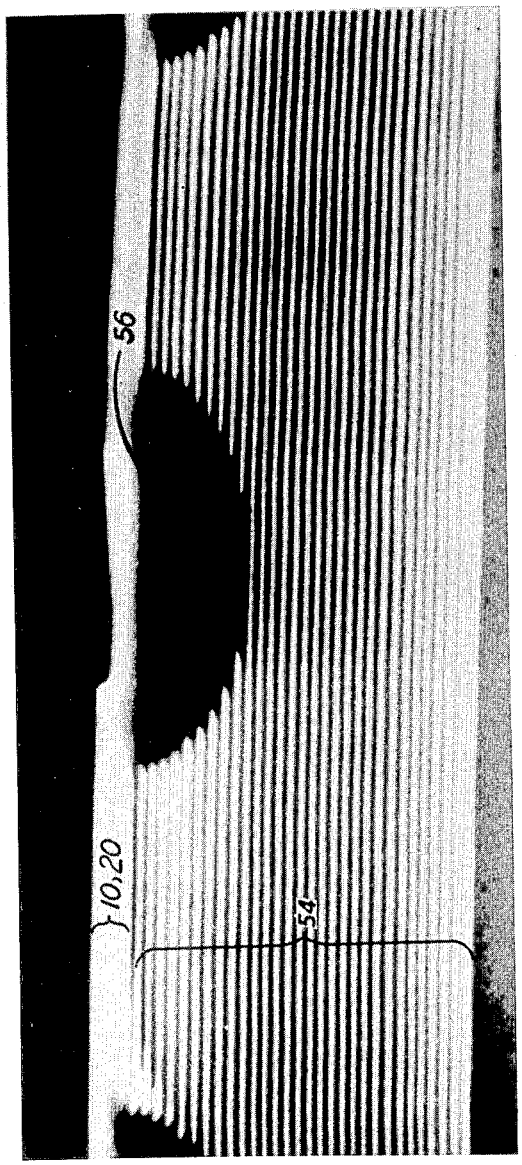
FIG. 6 is an enlarged side elevation of a portion of the SEM image of FIG. 5 including a profile of the thin film composite source of this invention relative to the disordering of discrete layers comprising a multilayer alloy.

FIGS. 4–6 illustrate the application of the forgoing processing with bilayer composite source 10 in performing patterned impurity induced disordering (IID) in fabricating a semiconductor device. The technique of impurity induced disordering (IID) has been developed as a means for crafting semiconductor structures, which technique may b defined as a process of enhanced rate of interdiffusion of ordered elemental constituents as initially formed in consecutively deposited layers of semiconductor compounds or alloys through the introduction, i.e., diffusion of an impurity into the layers. The utility of IID, as discussed in K. Meehan et al, "Disorder of an Al$_x$Ga$_{1-x}$As-GaAs Superlattice by Donor Diffusion:, *Applied Physics Letters*, Vol. 45(5) pp. 649–651, Sept. 1, 1984 and in U.S. Pat. No. 4,639,275, is useful in fabricating planar index waveguide structures in multilayer GaAs/GaAlAs semiconductor structures, such as for integrated optical waveguides and heterostructure lasers and array lasers. An example of its application in the fabrication of buried heterostructure lasers is disclosed in the article of R.L. Thornton et al entitled, "Highly Efficient, Long Lived AlGaAs Laser Fabricated by Silicon Impurity Induced Disordering", *Applied Physics Letters*, Vol. 49(3), pp. 133-134, July 21, 1986.

In FIG. 4, semiconductor structure 30 may be applicable relative to the formation of semiconductor heterostructure lasers. Structure 30 comprises a substrate 32 of n-GaAs on which are consecutively deposited layers 34-40 in an MO-CVD reactor, as is known in the art. These epitaxially deposited layers may be as follows: Cladding layer 34 of n-Ga$_{1-y}$Al$_y$As; active region 36 comprising a layer of GaAs or Ga$_{1-x}$Al$_x$As where y>x, or a single quantum well layer of GaAs or a multiple quantum well of alternating layers of GaAs and Ga$_{1-x}$Al$_x$As; cladding layer 38 of p-Ga$_{1-y}$Al$_y$As and a cap layer 40 of p+GaAs. Upon the completion of growth of these layers, a Si$_3$N$_4$ layer 20 is deposited on layer 40 an then structure 30 is removed from the MO-CVD reactor to selectively etch a pattern 42 into masking layer 20. The particular pattern may, for example, be comprised of a plurality of spaced, parallel grooves etched into layer 20 exposing regions of the underlying structure 30. After this selective etch step, structure 30 is returned to the MO-CVD reactor for deposition of source 10 in a manner as previously explained in connection with FIG. 1. During subsequent high temperature annealing, Si-Si pairs diffuse from layer 14 through pattern regions 42 and are substituted for Ga and As vacancies occurring in structure 30, particularly Ga vacancies caused by the migration of Ga atoms into film 14. As the annealing process is carried out, diffusion profiles 44 are formed which, after a sufficient amount of time, extend through active region 36 disordering this region, i.e., causing the interdiffusion of Ga and As between adjacent heterostructure layers comprising regions 36 as well as cladding layer 38, thereby smearing out the deposited integrity of these layers within the confines of profile 44. The disordering profile 44 produces a region of lower refractive index compared to undisordered region at 46 so that region 46 may function as an optical waveguide or as a diode laser optical cavity.

FIGS. 5 and 6 are SEM images of another semiconductor structure 50. Structure 50 is comprises a GaAs substrate 52 upon which is epitaxially deposited a superlattice 54 about 3.2 μm thick consisting of alternating layers, each about 350Å, or GaAs and Ga$_{1-x}$Al$_x$As, wherein x was equal to 0.40, followed by the deposition of masking layer 20 and bilayer composite source 10 applied in the manner as previously explained relative to FIGS. 1 and 2. The pattern in layer 20 comprises a series of spaced, parallel grooves over which source 10 is deposited. an anneal was performed for eight hours at 850° C. FIG. 6 shows that the Si diffusion profile 56 has extended into superlattice 54 about 1.2 μm disordering the superlattice layers and forming a homogeneouse Ga$_{1-y}$Al$_y$As alloy within the confines of profiles 56.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method of introducing impurity species into a semiconductor structure comprising the steps of depositing a Si or Ge diffusion source layer on the surface of said structure in the presence of a source of As, P or Sb heavily doping said layer in the range of 5 to 20 by atomic percent, depositing a thin cap layer on said Si or Ge diffusion source layer to prevent the outdiffusion of elemental constituents comprising said structure, thermally annealing said structure at a high temperature in the range of 700° C. to 900° C. to cause the diffusion of Si or Ge form said source layer into said structure, carrying out the deposition of said layers at a temperature in excess of 500° C. in order to minimize the occurrence of irregularities in the morphology of said layers and said structure due to thermal strain and compressive stress during said high temperature annealing.

said diffusion source layer comprising unhydrogenated amorphous Si or Ge to prevent the formation of irregularities in the morphology of said diffusion source layer due to hydrogen outdiffusion during said high temperature annealing and thereby permitting uniform diffusion of said Si or Ge into said semiconductor structure.

2. The method of introducing impurity species into a semiconductor structure of claim 1 wherein said layers are deposited at a temperature in the range of 500° C. to 900° C., preferably in the range of 700° C. to 850° C.

3. A method of converting at least a portion of a multilayer III-V semiconductor structure into a region having different bandgap properties than originally deposited layers in the region so converted from comprising the steps of epitaxially depositing a first III-V semiconductor region interposed between second III-V semiconductor regions of high bandgap than said first region depositing a impurity diffusion source layer on at least a portion of the surface of said III-V semiconductor structure in the presence of a diffusion enabling agent incorporated therein in the range of 5%-20% by atomic percent, depositing a thin passivating layer on said diffusion source layer of a thickness of prevent the outdiffusion of III-V elemental constituents therethrough, and thermally annealing said structure at a temperature to cause the diffusion of said impurity to said region converting said region into a disordered alloy of both said first and second semiconductors, said alloy exhibiting a higher energy gap than said first semiconductor region, said steps of deposition and annealing being performed at a temperature in the range of 600° C.-900° C.

* * * * *